United States Patent
Yach (10) Patent No.: US 8,878,183 B2
(45) Date of Patent: *Nov. 4, 2014

(54) METHOD AND APPARATUS FOR MONITORING SEMICONDUCTOR FABRICATION

(71) Applicant: Microchip Technology Incorporated, Chandler, AZ (US)

(72) Inventor: Randy Yach, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/831,101

(22) Filed: Mar. 14, 2013

(65) Prior Publication Data

US 2014/0264333 A1  Sep. 18, 2014

(51) Int. Cl.
*H01L 23/58* (2006.01)
*H01L 21/66* (2006.01)

(52) U.S. Cl.
CPC ..................... *H01L 22/34* (2013.01)
USPC ......... 257/48; 438/17; 438/462; 257/E23.002

(58) Field of Classification Search
USPC ............. 257/48, E21.001, E21.521, E23.002; 438/17, 462
See application file for complete search history.

(56) References Cited

U.S. PATENT DOCUMENTS

| | | | |
|---|---|---|---|
| 6,933,591 B1 | 8/2005 | Sidhu et al. | 257/665 |
| 7,919,973 B2 * | 4/2011 | Yach et al. | 324/750.3 |
| 2008/0308883 A1 | 12/2008 | Hong et al. | 257/412 |

FOREIGN PATENT DOCUMENTS

KR  100774789 B1  11/2007 ............ H01L 21/336

OTHER PUBLICATIONS

International Search Report and Written Opinion, Application No. PCT/US2014/020347, 13 pages.

* cited by examiner

*Primary Examiner* — Roy Potter
(74) *Attorney, Agent, or Firm* — King & Spalding L.L.P.

(57) ABSTRACT

A semiconductor chip for process monitoring of semiconductor fabrication, has a plurality of arrays with a plurality of diodes, each diode being formed in the chip, each diode being associated with a stack with at least one horizontal interconnect, the stack and the diode connected in series to form a diode stack combination, wherein the horizontal interconnect has a salicided polysilicon interconnect comprising complementary doped polysilicon sections to form a reverse biased diode.

20 Claims, 8 Drawing Sheets

METHOD AND APPARATUS FOR MONITORING SEMICONDUCTOR FABRICATION

TECHNICAL FIELD OF THE INVENTION

This invention relates generally to the field of monitoring the process of semiconductor fabrication of integrated circuits, whose products encompass a myriad application in various technical fields.

BACKGROUND

Semiconductor fabrication of integrated circuits continues to supply vital equipment to a myriad of technological fields. Integrated circuits continue to grow increasingly complex and densely filled with components. Accordingly, manufacturing these integrated circuits becomes more difficult. Makers of integrated circuits spend considerable effort increasing the yield of the fabrication process as well as increasing the reliability of its output. The metal interconnect system employed during the manufacturing of large and very large scale integrated circuits is of special concern to the yield and reliability of these products.

During the process of creating a semiconductor-based integrated circuit, various layers of semiconductors, metals, insulators, and other materials are deposited and patterned in layers on top of each other. Masks are employed to control the process and patterned to create connections between circuit elements. These connections can be either horizontal or vertical in nature. The horizontal interconnect layers are joined together by vertical connections called vias. These connections may be made between metal layers or from a metal layer to a semiconductor layer, in which case the connection is commonly referred to as a contact. All vertical interconnects will be hereafter referred to as vias.

The complexity of modern integrated circuits has been increasing due to both the further miniaturization of the circuits and also to the increase in the number of elements included in these systems and circuits. As the circuits become more complex, more layers are required to connect the ever increasing number of circuit elements. The increasing number of layers may also increase the number of horizontal interconnecting wires, which may add parasitic resistance. To improve the wire resistance, a horizontal interconnection wire may be made from polysilicon on top of which a silicide layer is formed. Silicides on polysilicon forms salicided polysilicon and is used to minimize a parasitic resistance and known to be used for gate structures in MOSFET devices (so-called polycide gate), on source-drain connections or as local interconnection. It provides for a low resistance, good process compatibility with silicon and good contact properties to other materials. It can be easily dry etched and provides for little or no electromigration.

However, an error in the manufacturing of an integrated circuit can amongst others be caused by a faulty or improper formation of the silicide layer, which could degrade the flow of electricity on a horizontal wire, or cause a component to malfunction. Further, an improper silicide layer may not cause the chip to fail immediately, but may degrade over time in the field, creating a reliability concern.

A semiconductor manufacturer can increase a process's ability to produce reliable and consistent interconnects by using a test structure containing a large chain of horizontal and vertical interconnects. This structure is typically used during the process development phase, and aids the process engineers in evaluating the robustness of the interconnect system. After the initial process development work, the integrated circuits rather than test structures are used to monitor the health of the process technology by metrics such as test yield and reliability experiments. Using the large integrated circuits for monitoring the health of the process can be problematic. When the product fails a test program, it is very difficult to determine the exact location and root cause of the failure because of the shear complexity of the device. A process using a test structure consisting of a chain of horizontal metal and vertical vias might be impractical because it does not pinpoint which specific element in the interconnect system caused the failure.

One solution to make the via and horizontal interconnect manufacturing process more robust is to design a two dimensional array of vias where it is possible to test individual vias through a decoding scheme utilizing transistors as switches to turn on and off connection paths to be tested. However, transistors occupy a significant amount of silicon area so as to limit how many vias and horizontal interconnects can be placed within the test structure. Further, a significant amount of current may be necessary to accurately measure the actual via and horizontal interconnect resistance. Transistors are relatively limited in the current they can carry. Thus, there exists a need for an improved process to monitor an interconnect system in a semiconductor manufacturing process in particular to monitor the salicide process for interconnect purposes.

SUMMARY

According to an embodiment, a semiconductor chip for process monitoring of semiconductor fabrication, has a plurality of arrays further comprising: a plurality of diodes, each the diode being formed in the chip, each the diode being associated with a stack comprising at least one horizontal interconnect, the stack and the diode connected in series to form a diode stack combination, wherein the horizontal interconnect comprises a salicided polysilicon interconnect comprising complementary doped polysilicon sections to form a reverse biased diode.

According to a further embodiment, a silicide layer can be formed on top of the complimentary doped polysilicon. According to a further embodiment, the silicide layer can be TiS2, CoSi2, NiSi, or WSi2. According to a further embodiment, the salicided polysilicon can be contacted by first and second vias arranged on top of the silicide layer, wherein the first via is located above a p+ doped polysilicon section and the second via is located above a n+ doped polysilicon section. According to a further embodiment, the stack further comprises at least one vertical interconnect comprising a plurality of vias and metal wires.

According to another embodiment, a test system may comprise a semiconductor as described above, and further comprise: a plurality of control mechanisms for addressing the diodes wherein the control mechanisms comprise: a device for applying a relatively high or low voltage to a plurality of columns of the diode stack combinations in the array, connected at a first end of the diode stack combination; and a device for applying a relatively high or low voltage to a plurality of rows of the diode stack combinations in the array, connected at a second end of the diode stack combination.

According to a further embodiment of the above system, the control mechanisms can be inverters. According to a further embodiment, the diodes can be formed by a first p-type semiconductor deposition into an n-type well which is arranged within a p-type substrate, the chip further comprising a plurality of electrical connections for each the diode comprising deposition of a second p-type semiconductor into the p-type substrate; and the arrays may further comprise a plurality of p-n-p parasitic transistors comprised of the electrical connections, the p-type substrate, the n-type well, and the first p-type semiconductor depositions. According to a further embodiment of the system, the parasitic transistors may share a physical location with the diodes, and the parasitic transistors and the diodes are connected in parallel. According to a further embodiment of the system, a plurality of p-type semiconductor regions can be deposited adjacent to each the diode, the p-type semiconductor regions connected to the terminal of a transistor adjacent to the diode in the substrate of the chip. According to a further embodiment of the system, the p-type semiconductor regions adjacent to each diode in the array can be connected together. According to a further embodiment of the system, the p-type semiconductors regions can be connected to a first voltage, the voltage having a lower potential than the high voltage applicable to a column of diode stack combinations.

According to another embodiment, a system for process monitoring of semiconductor fabrication, may comprise a semiconductor chip further comprising: a plurality of arrays further comprising: a plurality of diodes, each diode being formed in the chip, each the diode being associated with a stack comprising at least one metal contact and at least one horizontal interconnect, wherein the horizontal interconnect comprises a salicided polysilicon interconnect comprising complementary doped polysilicon sections to form a reverse biased diode, the stack and the diode connected in series to form a diode stack combination; a plurality of control mechanisms for addressing the diodes wherein the control mechanisms comprise: a device for applying a relatively high or low voltage to a plurality of columns of the diode stack combinations in the array, connected at a first end of the diode stack combination; a device for applying a relatively high or low voltage to a plurality of rows of the diode stack combinations in the array, connected at a second end of the diode stack combination, and wherein the device is further operable to measure a current through the diode stack combination.

According to a further embodiment of the above system, the stack may further comprise at least one vertical interconnect comprising a plurality of vias and metal wires. According to a further embodiment of the above system, the control mechanisms can be inverters. According to a further embodiment of the above system, the diodes can be formed by a p-n transition within the semiconductor chip formed by a first p-type semiconductor area in an n-type well, wherein the n-type well is arranged in a p-type substrate; the chip may further comprise a plurality of electrical connections for each the diode comprising deposition of a second p-type semiconductor into the p-type substrate; and the arrays may further comprise a plurality of p-n-p parasitic transistors comprised of the electrical connections, the p-type substrate, the n-type well, and the first p-type semiconductor depositions. According to a further embodiment of the above system, the parasitic transistors may share a physical location with the diodes, and the parasitic transistors and the diodes are connected in parallel. According to a further embodiment of the above system, the semiconductor chip may further comprise a plurality of p-type semiconductor regions arranged adjacent to each the diode, the p-type semiconductor regions connected to the terminal of a transistor adjacent to the diode in the substrate of the chip. According to a further embodiment of the above system, the p-type semiconductor regions adjacent to each diode in the array can be connected together. According to a further embodiment of the above system, the p-type semiconductors regions can be connected to a first voltage, the voltage having a lower potential than the high voltage applicable to a column of diode and stack combinations.

BRIEF DESCRIPTION OF THE DRAWINGS

For a more complete understanding of the present invention and advantages thereof, reference is now made to the following description taken in conjunction with the accompanying drawings, in which.

DETAILED DESCRIPTION

Figure 1:
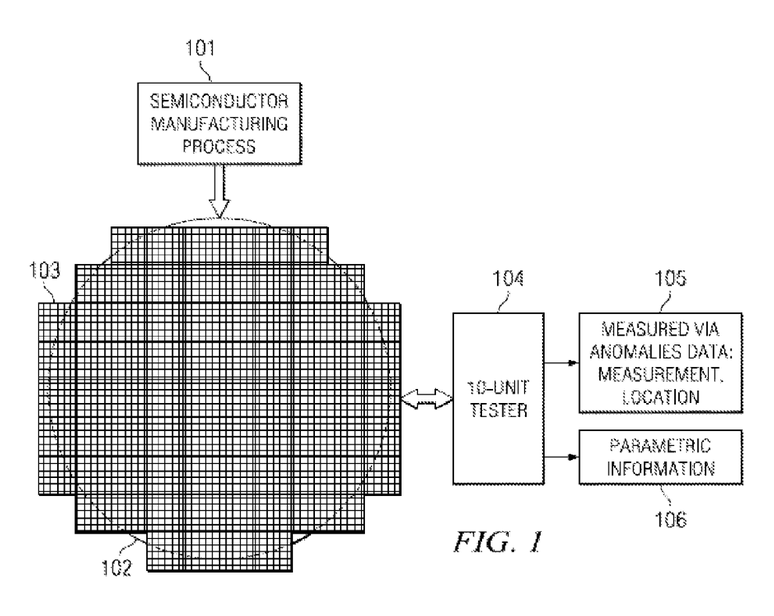
FIG. 1: Overview Of Monitoring Process

FIG. 1 shows the general process by which according to various embodiments a semiconductor manufacturing process may be monitored by testing stacks of vertical interconnects and metal contacts. A semiconductor manufacturing process 101 to be monitored or evaluated creates a wafer 102 containing a plurality of chips 103. In one embodiment of the invention, each chip contains a plurality of diodes arranged in an addressable array. Each diode may have an associated stack of vertical interconnects and metal contacts. Each chip is tested by a probing tester 104 to find the location and measurement of stacks that do not meet specifications. In one embodiment, a tester 104 that can test ten different chips in parallel is used. In one embodiment, ten chips are tested at the same time. In one embodiment, the same stack on each chip is tested at the same time. The tester 104 yields information, such as data sets for measured anomalies 105 containing the measurement as well as the location of the measurement. The anomalies are current measurements or associated resistance calculations of interconnects on the wafer that are open, meaning no current was measured, or current measurements that do not meet certain criteria. The tester 104 may also yield parametric information 106 detailing the tests that were conducted. By analyzing the measurements returned by the tester, possible problems in the manufacturing process may be detected.

Figure 2:
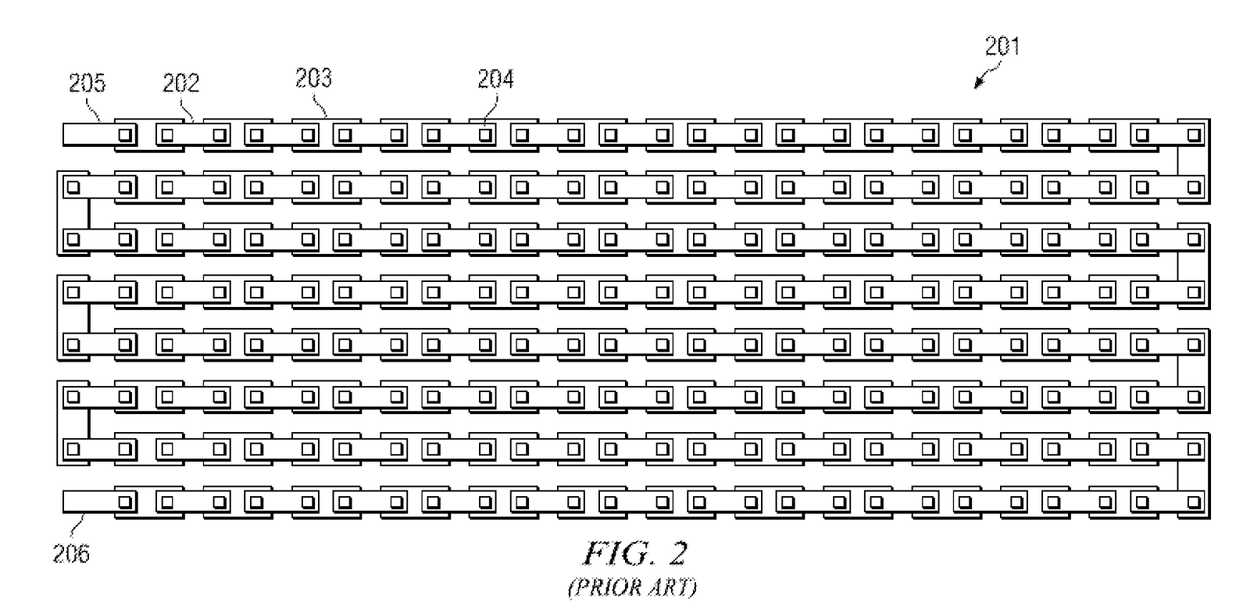
FIG. 2: Prior Art—Via Chain Testing

FIG. 2 shows prior art for monitoring a semiconductor manufacturing process by creating a chip comprising a series of components connected together in a chain 201 so as to contain multiple vias over a certain area of the chip. Connections are made between two different layers 202, 203. The layers may be made from metal or semiconductors. The interconnection of the two layers forms the via 204. Consequently, a large number of vias are contained within the chain to cover an area of the chip. To test the vias, the current flowing through the chain is measured after applying a potential between the top 205 of the chain and the bottom 206 of the chain. A failed via will cause the current flowing through the chain to drop.

Figure 3:
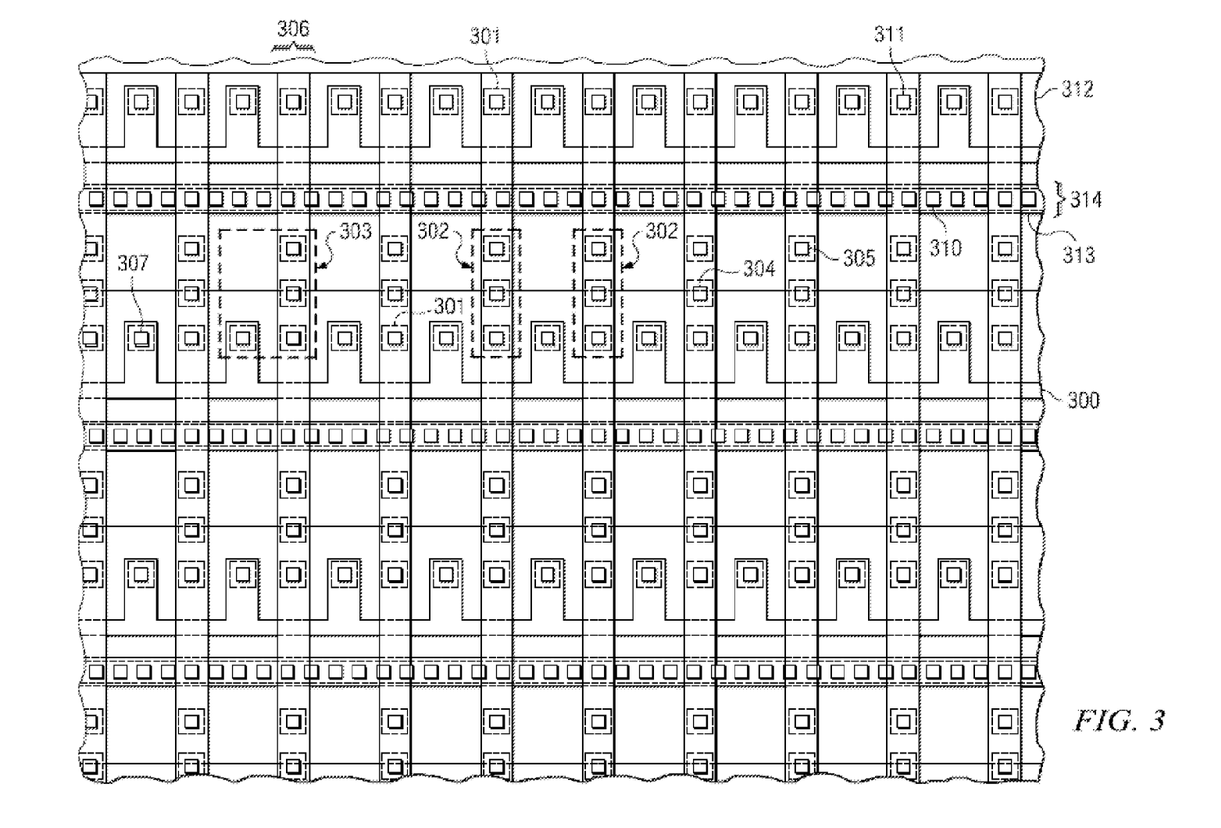
FIG. 3: Test Chip

FIG. 3 shows that in one embodiment each chip is built with a plurality of diodes and associated stacks of vertical interconnects and metal contacts aligned in a grid. A diode 301 is laid out through a deposition process described below. The diode 301 is connected to a stack 302 of vertical interconnects and metal contacts, forming a combination 303. The stack 302 may comprise several levels of vertical interconnects and metal contacts. A first contact 304 contained within the stack 302 serves to connect the stack 302—and therefore the combination 303—to other stacks and diodes in the same column 306 of diode and stack combinations 303. A second contact 305 contained within the stack may comprise various other levels of vertical interconnects and metal contacts, which may not serve a connective function within the chip, but exist for testing purposes. The anode 307 of the diode is connected to the anodes 307 of other diodes 301 in the same row 308 through a contact layer. Substrate contacts 310 also connect parasitic transistors formed by the series combination of a P+ contact 311 arranged in an N-Well 312 which itself is arranged in a P+ substrate 313. A contact layer 314 serves both as a substrate connection as well as the emitter of the parasitic PNP transistor.

In one embodiment, the diode and stack combinations 303 comprise an addressable diode read-only-memory array. In one embodiment, the chip is comprised of 9,216 unique addressable diode and stack combinations 303. The physical location of each combination 303 is known or can be determined by knowing the test, tester, and address used to test the combination 303. Other physical layouts may be used so long as the physical location of an individual diode and related stack can be found.

Figure 4A:
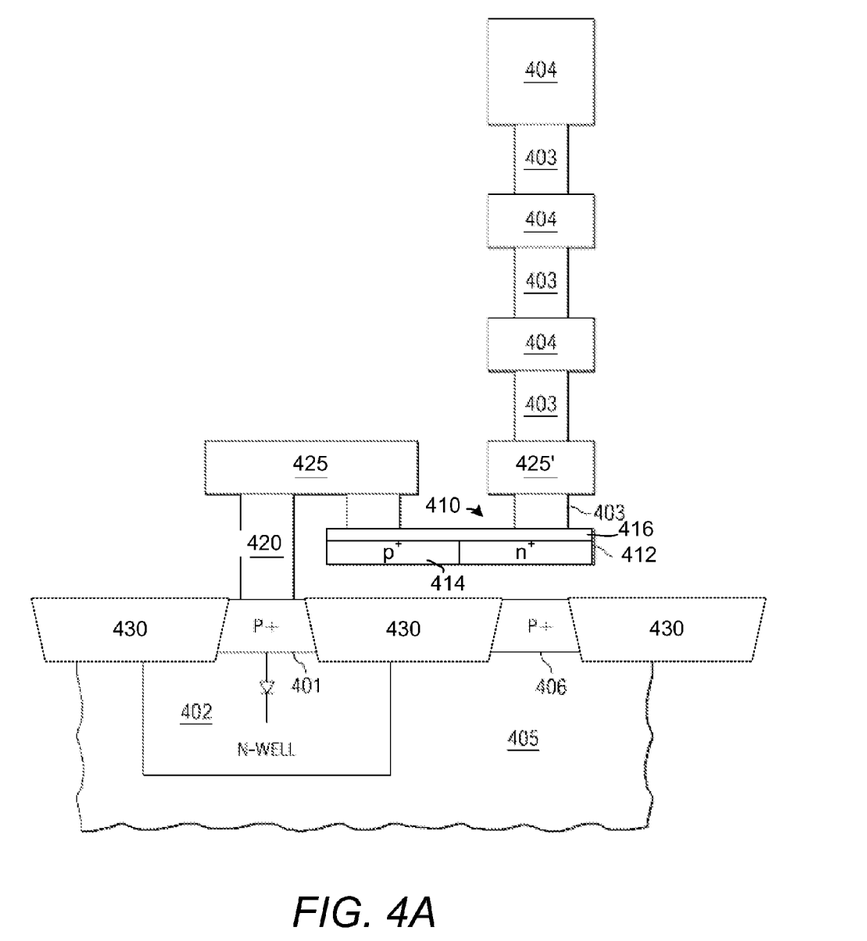
FIGS. 4A-4B: Cross Section Of A Diode And Associated Stack

FIG. 4 shows a cross-section of a diode and associated stack. To form the diode, a $p^+$ region 401 is deposited into an N-Well 402. This arrangement forms the basic structure of a p-n junction of a diode. The N-Well 402 may itself be arranged in a $p^+$ substrate 405. Above this diode are deposited various layers of connections, possibly including various contacts, vias and metal interconnects. For example, FIG. 4 shows contact 420 connecting the diode with a first metal layer comprising wire 425. The first metal layer may also comprise another wire 425' which is coupled with wire 425 through vias 403 and a horizontal interconnect wire 410. To improve resistance of the horizontal interconnect 410 the interconnect wire 410 comprises a salicided polysilicon wire 412/414 comprising polysilicon sections 412 and 414 on top of which a silicide layer 416 is formed. The silicide layer may be $TiS_2$, $CoSi_2$, NiSi, $WSi_2$, or any other suitable material.

According to various embodiments the polysilicon wire portion is formed by two differently doped polysilicon sections 412 and 414. Section 414 is p+ doped whereas section 412 is n+ doped. These sections divide the horizontal polysilicon wire into two sections of approximately equal length as shown in FIG. 4. However according to other embodiments, these sections are not required to have equal length but must only be dimensioned to from a diode under the silicide layer 416. Thus, sections 412 and 414 are complementary doped polysilicon to form a reverse biased diode within the poly interconnect 410. The silicide layer 416 if properly formed shorts this diode. Thus, diode 412/414 only becomes active if the silicide layer 416 is improperly formed. Vias 403 connect the vertical stack 403/404 with the horizontal polysilicon wire 410 wherein the stack connecting via 403 is located above the n+-doped section 412. A second via is located above the p+ doped section 414 to connect the polysilicon wire 410 with metal layer 425. Thus, in case the silicide layer 416 is improperly formed, the two sections 412 and 414 form a reverse biased diode and force an open circuit as compared to a conventional uniformly doped polysilicon layer that would merely have a reduced resistance if the overlaying silicide layer is improperly formed. The open circuit caused by the reversed biased diode when the silicide layer 416 is improperly formed can be easily detected by a respective test machine. It is important that the diode formed by 412 and 414 be in the opposite direction with respect to current flow as the decode diode formed by 401 and 402. Anyone skilled in the art will realize that both of these diodes can be reversed and still work according to the intended function of this invention.

In one embodiment, the stack of connections 403 and 404 formed by the various layers can be used for monitoring the manufacturing process of the interconnect layers. In one embodiment, the stack may only include via 403 and metal wire 425' or may even only include a single connecting via or metal contact. Hence, the connecting structure coupled with the silicode layer 416 above the n+-doped region can have various forms and is not critical to the test structure 410 itself.

As shown in FIG. 4, according to other embodiment, the stack 403/404 comprises multiple wires 404 and connecting vias 403 and is connected to the diode 401/402 through the horizontal interconnect 410 and contact 420, which serves as a terminal for the diode's cathode. In one embodiment, by depositing the N-Well 402 into a P-Well 405 substrate, a parasitic PNP bipolar transistor is also created. To access the functionality of this transistor, an additional P+ region 406 may be deposited into the substrate 405 in order to provide a connection from the substrate 405. Also as shown with the dotted lines in some embodiments field oxide regions 430 may further separate the various active regions from each other.

Figure 5:
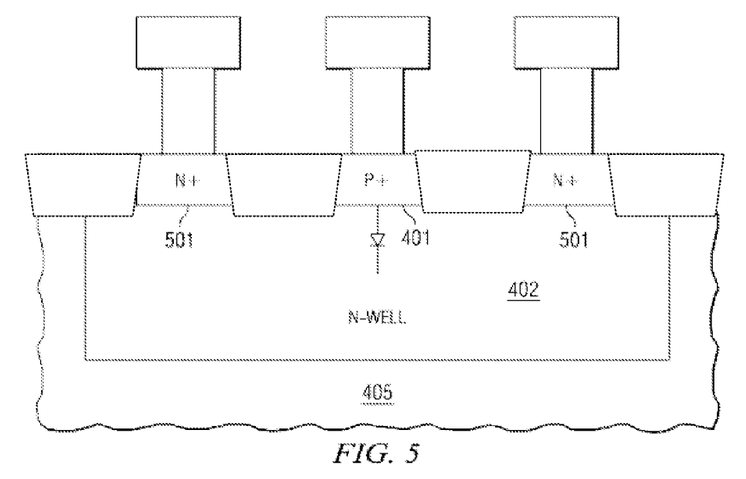
FIG. 5: Side-View Of Cross Section Of A Diode And Associated Stack

FIG. 5 shows a cross section of the diode and associated stack rotated ninety degrees from FIG. 3. A plurality of N+ regions 501 are deposited into the N-Well 402 in order for a connection to be made to the anode of the diode. The N+ regions 501 on each diode and stack combination may be connected to the other combinations within the same row of diodes. Additionally, N-Well 402 may be shared across the same row of diodes.

Figure 4B:
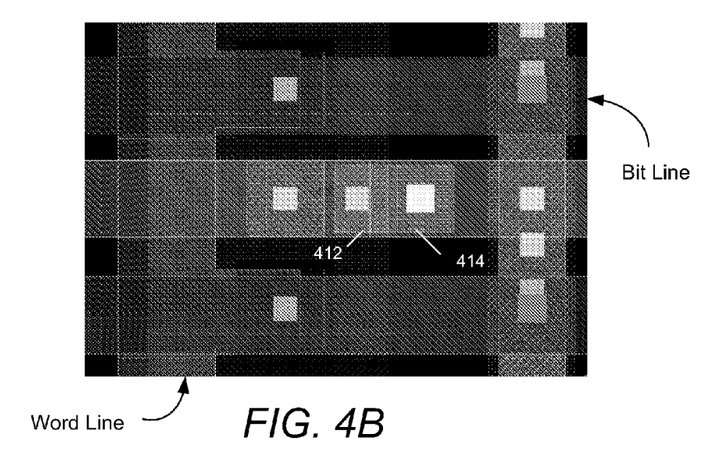
Figure 6:
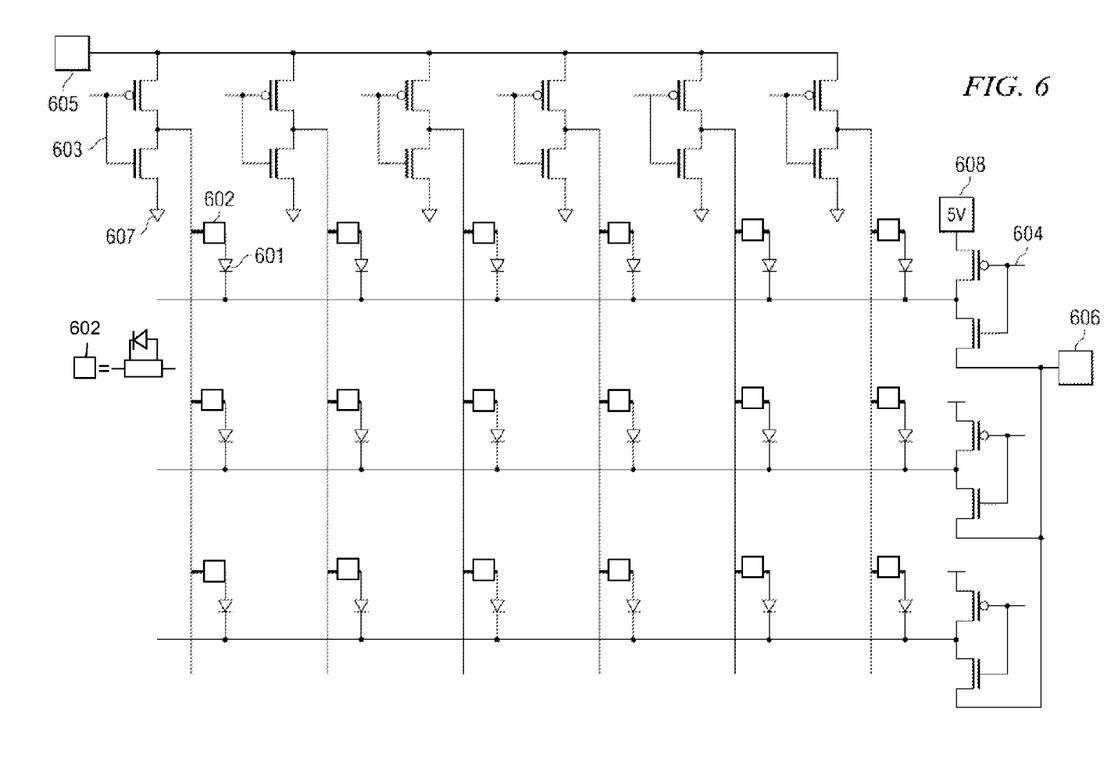
FIG. 6: Circuit Equivalent of the Diode Arrangement

FIG. 4B shows an another more detailed top view depicting the horizontal interconnect section 410 with co-doped polysilicon sections 412 and 414. FIG. 6 shows an electrical circuit of the arrangement of the diodes in one embodiment of the invention. To address the diodes as an array, the diodes 601 have been laid out and are connected as a two-dimensional array with columns and rows. Corresponding to each diode is a stack 602 of vertical interconnects and metal contacts which is indicated on the left side of FIG. 6, including the polysilicon diode 412/414 covered with silicide layer 416. In one embodiment, a plurality of inverters 603 are connected to each column of diodes at the cathode and act as a control mechanism for selecting which column contains the diode and associated stack that will be tested. A plurality of inverters 604 are connected to each row of diodes at the anode and act as a control mechanism for selecting which row contains the diode and associated stack that will be tested. A voltage source 605 is connected to the column inverters 603, and a voltage sink 606 is connected to the row inverters 604. In one embodiment, the voltage source 605 is four volts, and the voltage sink 606 is one volt. Each column inverter 603 also has inputs for selecting whether the inverter will route the voltage source 605 or instead a low voltage 607. In one embodiment, the low voltage is ground. Each row inverter 604 also has inputs for selecting whether the inverter will route the voltage sink 606 or instead a high voltage 608. In one embodiment, the high voltage is five volts. The stack 602 of vertical interconnects and contacts is in series with the column selector inverter 603 and the diode 601.

Figure 7:
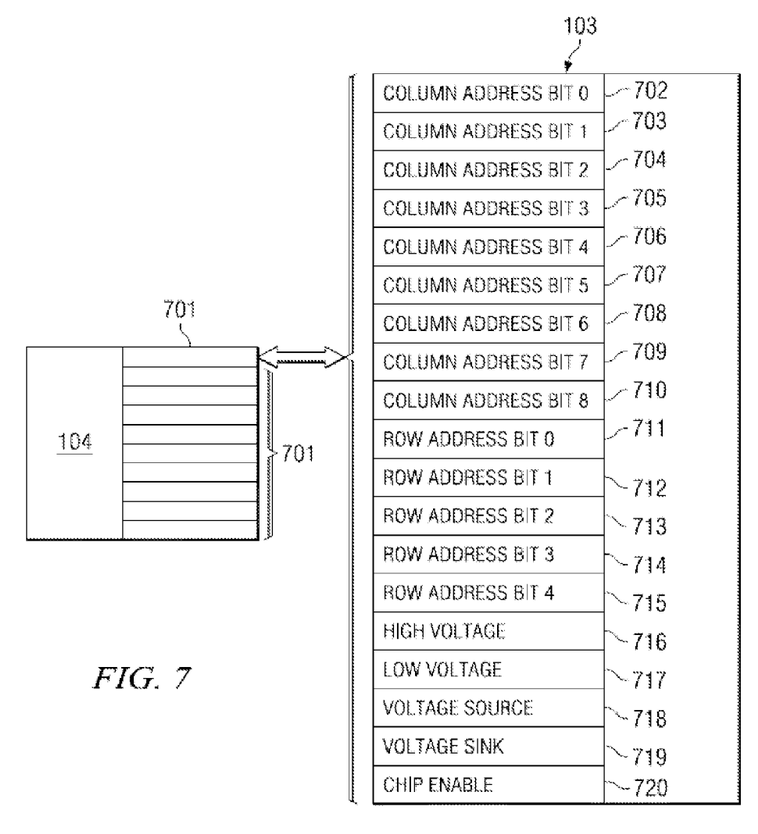
FIG. 7: Tester and Chip Interface Apparatus

FIG. 7 shows the means by which the tester 104 will access the chip 103 for testing. In one embodiment, the tester has ten separate test heads 701, each capable of testing a chip 103 in parallel with other test heads 701. Each test head 701 can access the chip 103 through a series of pins. A plurality of column address bits 702-710 may be used to address the column of the stack to be tested. A plurality of row address bits 711-715 may be used to address the row of the stack to be tested. A high voltage pin 716 may be used to provide power to the chip, as well as a voltage to the anode of diodes corresponding to stacks not under test. A low voltage pin 717 may be used to provide ground to the chip 103, as well as a voltage to the cathode of diodes corresponding to stacks not under test. A voltage source pin 718 may be used to provide a positive voltage on the cathode side of a diode and stack combination under test. A voltage sink pin 719 may be used to provide a voltage relatively smaller than the voltage source on the anode side of a diode and stack combination under test. A chip enable pin 720 may be used to enable or disable measurement of current. Current may be measured by the test head 701 by examining the flow of current into the voltage source pin 718.

Figure 8:
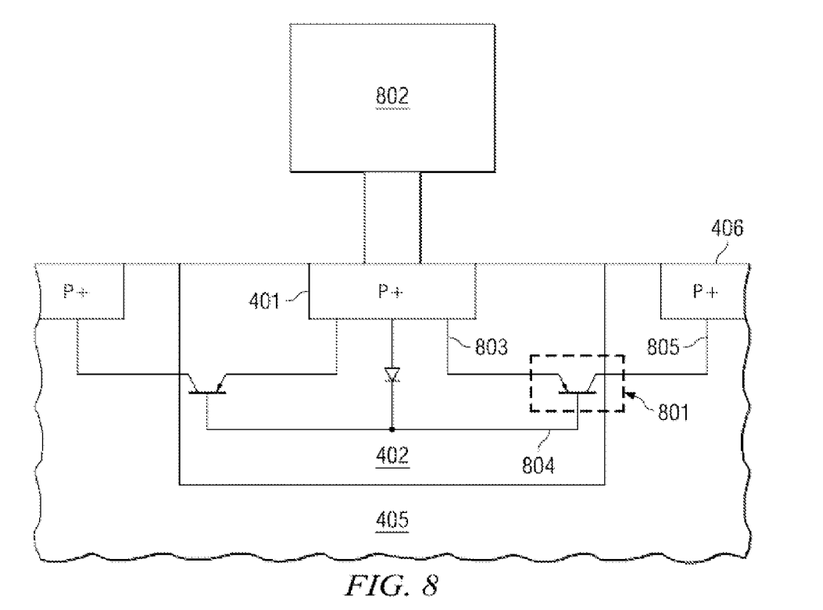
FIG. 8: Parasitic Bipolar Transistor

In FIG. 8 the entire stack as shown in detail in FIG. 4A is represented by reference symbol 802. FIG. 8 shows an enhanced embodiment comprising arranging the diode into a P+ substrate, forming a bipolar junction transistor, which allows more current to flow through stack. The resolution of the stack resistance calculation increases with the amount of current that can flow through the stack. The diode and stack are connected in series, and consequently the diode acts as the limiting factor in the amount of current that can flow through the stack.

If the diode, created by depositing a P+ region 401 into an N-Well 402, is itself arranged in a P+ substrate 405, a PNP transistor 801 is formed. The current able to flow through the stack 802 be increased by utilizing this transistor. As shown in FIG. 4, second P+ regions 406 are added to access the transistor through its collector terminal 805. In one embodiment, the second P+ regions are connected to other P+ regions on other diode and stack combinations. In one embodiment, the second P+ regions are connected to ground. The first P+ region 401 forming the diode connects the stack 802 to the emitter terminal 803 of the transistor. The N-Well 402 connects the anode of the diode to the transistor base terminal 804.

Figure 9:
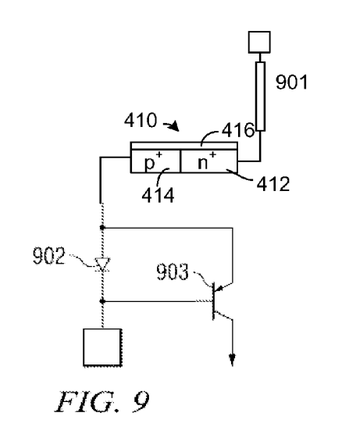
FIG. 9: Circuit Equivalent Showing Stack, co-doped and salicided Poly, Diode, And Transistor

FIG. 9 demonstrates the circuit equivalent of these elements. The via stack 901 is connected in series with the co-doped and salicided polysilicon interconnect 410 and the combination of the diode 902 and the parasitic transistor 903, the diode 902 and the parasitic transistor 903 being connected in parallel. The flow of a small amount of current from the diode 902 into the base of the transistor 903 activates the forward mode of the transistor 903, causing current to flow through the transistor. The result is that more current can flow through the stack 901. As long as the silicide layer 416 is intact, structure 410 acts as a low resistance wire interconnect. Only when the silicide layer 410 is improperly formed, for example comprises gaps or is broken, the structure 410 acts as a reversed biased diode preventing any current to flow.

The operation of the chip to measure the current through a stack of vertical interconnects and metal contacts according to various embodiment can be performed similar to the methods described in U.S. Pat. No. 8,072,233 and U.S. Pat. No. 7,919,973 assigned to Applicant which are hereby incorporated by reference.

What is claimed is:

1. A semiconductor chip for process monitoring of semiconductor fabrication, comprising:
    a plurality of arrays further comprising:
        a plurality of diodes, each said diode being formed in the chip, each said diode being associated with a stack comprising at least one horizontal interconnect, said stack and said diode connected in series to form a diode stack combination,
    wherein the horizontal interconnect comprises a salicided polysilicon interconnect comprising complementary doped polysilicon sections to form a reverse biased diode.

2. The semiconductor chip according to claim 1, wherein a silicide layer is formed on top of the complimentary doped polysilicon.

3. The semiconductor chip according to claim 1, wherein the silicide layer is $TiS_2$, $CoSi_2$, $NiSi$, or $WSi_2$.

4. The semiconductor chip according to claim 2, wherein the salicided polysilicon is contacted by first and second vias arranged on top of said silicide layer, wherein the first via is located above a p+ doped polysilicon section and the second via is located above a n+ doped polysilicon section.

5. The semiconductor chip according to claim 1, wherein the stack further comprises at least one vertical interconnect comprising a plurality of vias and metal wires.

6. A test system comprising a semiconductor according to claim 1, and further comprising:
    a plurality of control mechanisms for addressing said diodes wherein said control mechanisms comprise:
        a device for applying a relatively high or low voltage to a plurality of columns of said diode stack combinations in said array, connected at a first end of said diode stack combination; and
        a device for applying a relatively high or low voltage to a plurality of rows of said diode stack combinations in said array, connected at a second end of said diode stack combination.

7. The system of claim 6, wherein the control mechanisms are inverters.

8. The system of claim 6, wherein the diodes are formed by a first p-type semiconductor deposition into an n-type well which is arranged within a p-type substrate,
    said chip further comprising a plurality of electrical connections for each said diode comprising deposition of a second p-type semiconductor into said p-type substrate; and
    said arrays further comprising a plurality of p-n-p parasitic transistors comprised of said electrical connections, said p-type substrate, said n-type well, and said first p-type semiconductor depositions.

9. The system of claim 8, wherein said parasitic transistors share a physical location with said diodes, and said parasitic transistors and said diodes are connected in parallel.

10. The system of claim 6, wherein a plurality of p-type semiconductor regions are deposited adjacent to each said diode, said p-type semiconductor regions connected to the terminal of a transistor adjacent to said diode in the substrate of said chip.

11. The system of claim 10, wherein the p-type semiconductor regions adjacent to each diode in a said array are connected together.

12. The system of claim 10, wherein the p-type semiconductors regions are connected to a first voltage, said voltage having a lower potential than said high voltage applicable to a column of diode stack combinations.

13. A system for process monitoring of semiconductor fabrication, comprising:
    a semiconductor chip further comprising:
        a plurality of arrays further comprising:

a plurality of diodes, each said diode being formed in the chip, each said diode being associated with a stack comprising at least one metal contact and at least one horizontal interconnect, wherein the horizontal interconnect comprises a salicided polysilicon interconnect comprising complementary doped polysilicon sections to form a reverse biased diode, said stack and said diode connected in series to form a diode stack combination;

a plurality of control mechanisms for addressing said diodes wherein said control mechanisms comprise:

a device for applying a relatively high or low voltage to a plurality of columns of said diode stack combinations in said array, connected at a first end of said diode stack combination;

a device for applying a relatively high or low voltage to a plurality of rows of said diode stack combinations in said array, connected at a second end of said diode stack combination, and wherein the device is further operable to measure a current through said diode stack combination.

14. The system according to claim 13, wherein the stack further comprises at least one vertical interconnect comprising a plurality of vias and metal wires.

15. The system of claim 13, wherein the control mechanisms are inverters.

16. The system of claim 13, wherein the diodes are formed by a p-n transition within said semiconductor chip formed by a first p-type semiconductor area in an n-type well, wherein the n-type well is arranged in a p-type substrate;

said chip further comprising a plurality of electrical connections for each said diode comprising deposition of a second p-type semiconductor into said p-type substrate; and said arrays further comprising a plurality of p-n-p parasitic transistors comprised of said electrical connections, said p-type substrate, said n-type well, and said first p-type semiconductor depositions.

17. The system of claim 16, wherein said parasitic transistors share a physical location with said diodes, and said parasitic transistors and said diodes are connected in parallel.

18. The system of claim 13, wherein said semiconductor chip further comprises a plurality of p-type semiconductor regions arranged adjacent to each said diode, said p-type semiconductor regions connected to the terminal of a transistor adjacent to said diode in the substrate of said chip.

19. The system of claim 18, wherein the p-type semiconductor regions adjacent to each diode in a said array are connected together.

20. The system of claim 18, wherein the p-type semiconductors regions are connected to a first voltage, said voltage having a lower potential than said high voltage applicable to a column of diode and stack combinations.

* * * * *